(12) United States Patent
Cheng (10) Patent No.: US 8,569,159 B2
(45) Date of Patent: Oct. 29, 2013

(54) CMOS STRUCTURE INCLUDING NON-PLANAR HYBRID ORIENTATION SUBSTRATE WITH PLANAR GATE ELECTRODES AND METHOD FOR FABRICATION

(75) Inventor: Kangguo Cheng, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/453,215

(22) Filed: Apr. 23, 2012

(65) Prior Publication Data

US 2012/0199910 A1 Aug. 9, 2012

Related U.S. Application Data

(63) Continuation of application No. 12/039,177, filed on Feb. 28, 2008, now Pat. No. 8,211,786.

(51) Int. Cl.
 *H01L 21/3205* (2006.01)
(52) U.S. Cl.
 USPC ........... 438/585; 438/162; 438/163; 438/458; 257/255; 257/351; 257/506
(58) Field of Classification Search
 USPC .......... 438/162–168, 458, 585; 257/351, 255, 257/506, 369, E27.062, E29.004, E27.046, 257/E21.294
 See application file for complete search history.

(56) References Cited

U.S. PATENT DOCUMENTS

| | | | |
|---|---|---|---|
| 4,450,620 A * | 5/1984 | Fuls et al. ................. | 438/301 |
| 4,868,135 A | 9/1989 | Ogura et al. | |
| 4,994,402 A | 2/1991 | Chiu | |
| 5,100,830 A | 3/1992 | Morita | |
| 5,134,085 A | 7/1992 | Gilgen et al. | |
| 5,258,096 A | 11/1993 | Sandhu et al. | |
| 5,346,587 A * | 9/1994 | Doan et al. ................. | 438/585 |
| 5,384,473 A * | 1/1995 | Yoshikawa et al. .......... | 257/255 |
| 5,453,396 A | 9/1995 | Gonzalez et al. | |
| 5,479,033 A * | 12/1995 | Baca et al. ................. | 257/192 |
| 5,482,878 A | 1/1996 | Burger et al. | |
| 5,508,535 A * | 4/1996 | Nakanishi .................. | 257/192 |
| 5,563,096 A | 10/1996 | Nasr | |

(Continued)

OTHER PUBLICATIONS

H. Irie et al., In-Plane Mobility Anisotropy and Universality Under Uni-axial Strains in n- and p-MOS Inversion Layers on (100), (110), and (111) Si, IEEE, 2004.

(Continued)

*Primary Examiner* — N Drew Richards
*Assistant Examiner* — Ankush Singal
(74) *Attorney, Agent, or Firm* — Scully, Scott, Murphy & Presser, P.C.; Joseph Petrokaitis, Esq.

(57) ABSTRACT

A semiconductor structure and a method for fabricating the semiconductor structure include a hybrid orientation substrate having a first active region having a first crystallographic orientation that is vertically separated from a second active region having a second crystallographic orientation different than the first crystallographic orientation. A first field effect device having a first gate electrode is located and formed within and upon the first active region and a second field effect device having a second gate electrode is located and formed within and upon the second active region. Upper surfaces of the first gate electrode and the second gate electrode are coplanar. The structure and method allow for avoidance of epitaxial defects generally encountered when using hybrid orientation technology substrates that include coplanar active regions.

18 Claims, 6 Drawing Sheets

(56) References Cited

U.S. PATENT DOCUMENTS

| | | | |
|---|---|---|---|
| 5,593,915 A | 1/1997 | Ohoka | |
| 5,939,240 A | 8/1999 | Kobayashi | |
| 6,001,681 A | 12/1999 | Liu et al. | |
| 6,051,860 A | 4/2000 | Odanaka et al. | |
| 6,114,194 A | 9/2000 | Hsu | |
| 6,133,115 A | 10/2000 | Fukase | |
| 6,190,975 B1* | 2/2001 | Kubo et al. | 438/285 |
| 6,194,293 B1 | 2/2001 | Krivokapic | |
| 6,277,720 B1 | 8/2001 | Doshi et al. | |
| 6,503,838 B1* | 1/2003 | Swanson | 438/692 |
| 6,545,324 B2 | 4/2003 | Madhukar et al. | |
| 6,566,204 B1 | 5/2003 | Wang et al. | |
| 6,624,476 B1 | 9/2003 | Chan et al. | |
| 6,670,694 B2 | 12/2003 | Momose | |
| 6,693,010 B1 | 2/2004 | Mirgorodski | |
| 6,724,019 B2 | 4/2004 | Oda et al. | |
| 6,815,278 B1 | 11/2004 | Ieong et al. | |
| 6,830,962 B1 | 12/2004 | Guarini et al. | |
| 6,897,095 B1* | 5/2005 | Adetutu et al. | 438/119 |
| 6,902,962 B2 | 6/2005 | Yeo et al. | |
| 6,916,698 B2 | 7/2005 | Mocuta | |
| 6,949,768 B1* | 9/2005 | Anderson et al. | 257/74 |
| 6,967,132 B2 | 11/2005 | Gonzalez et al. | |
| 6,972,478 B1 | 12/2005 | Waite et al. | |
| 7,023,055 B2 | 4/2006 | Ieong et al. | |
| 7,049,661 B2 | 5/2006 | Yamada et al. | |
| 7,102,166 B1* | 9/2006 | Bryant et al. | 257/64 |
| 7,199,451 B2 | 4/2007 | Kelman | |
| 7,268,377 B2 | 9/2007 | Ieong et al. | |
| 7,271,043 B2* | 9/2007 | Zhu et al. | 438/199 |
| 7,282,401 B2* | 10/2007 | Juengling | 438/203 |
| 7,315,066 B2 | 1/2008 | Atkisson et al. | |
| 7,354,814 B2 | 4/2008 | Orlowski et al. | |
| 7,381,999 B1 | 6/2008 | Yang | |
| 7,417,250 B1 | 8/2008 | Buller et al. | |
| 7,435,652 B1* | 10/2008 | Chen et al. | 438/275 |
| 7,439,110 B2 | 10/2008 | Cheng et al. | |
| 7,479,421 B2* | 1/2009 | Kavalieros et al. | 438/197 |
| 7,501,674 B2* | 3/2009 | Lee et al. | 257/288 |
| 7,514,313 B2* | 4/2009 | Zia et al. | 438/218 |
| 7,547,641 B2 | 6/2009 | Ieong et al. | |
| 7,592,678 B2 | 9/2009 | Li | |
| 7,659,583 B2* | 2/2010 | Ren et al. | 257/351 |
| 7,687,340 B2 | 3/2010 | Adkisson et al. | |
| 7,692,250 B2 | 4/2010 | Booth, Jr. et al. | |
| 7,696,574 B2 | 4/2010 | Zhu | |
| 7,785,955 B2 | 8/2010 | Anderson et al. | |
| 7,986,029 B2* | 7/2011 | Chuang et al. | 257/618 |
| 8,193,567 B2* | 6/2012 | Kavalieros et al. | 257/288 |
| 2002/0130393 A1 | 9/2002 | Takayanagi et al. | |
| 2002/0185676 A1 | 12/2002 | Momose | |
| 2003/0219953 A1 | 11/2003 | Mayuzumi | |
| 2003/0227013 A1 | 12/2003 | Currie et al. | |
| 2004/0256700 A1 | 12/2004 | Doris et al. | |
| 2005/0045995 A1 | 3/2005 | Ieong et al. | |
| 2005/0064646 A1 | 3/2005 | Chidanbarrao | |
| 2005/0215014 A1* | 9/2005 | Ahn et al. | 438/275 |
| 2005/0233533 A1 | 10/2005 | Alshareef et al. | |
| 2005/0236687 A1 | 10/2005 | Chan et al. | |
| 2005/0275018 A1 | 12/2005 | Venkatasan et al. | |
| 2006/0017137 A1 | 1/2006 | Iwamatsu | |
| 2006/0073646 A1* | 4/2006 | Yang | 438/152 |
| 2006/0113605 A1 | 6/2006 | Currie | |
| 2006/0125013 A1 | 6/2006 | Rim | |
| 2006/0145264 A1 | 7/2006 | Chidambarrao et al. | |
| 2006/0194421 A1 | 8/2006 | Ieong et al. | |
| 2006/0228851 A1* | 10/2006 | Sadaka et al. | 438/221 |
| 2006/0273397 A1 | 12/2006 | Adkisson et al. | |
| 2006/0275971 A1 | 12/2006 | Fogel et al. | |
| 2006/0292770 A1* | 12/2006 | Wu et al. | 438/187 |
| 2007/0018248 A1 | 1/2007 | Chuang et al. | |
| 2007/0040235 A1 | 2/2007 | Chan et al. | |
| 2007/0048919 A1 | 3/2007 | Adetutu et al. | |
| 2007/0069304 A1 | 3/2007 | Aida et al. | |
| 2007/0082453 A1 | 4/2007 | Orlowski | |
| 2007/0090467 A1 | 4/2007 | Zhu | |
| 2007/0096195 A1* | 5/2007 | Hoentschel et al. | 257/315 |
| 2007/0228478 A1* | 10/2007 | Mikasa | 257/368 |
| 2007/0235807 A1 | 10/2007 | White | |
| 2007/0235813 A1* | 10/2007 | Zia et al. | 257/369 |
| 2007/0238233 A1* | 10/2007 | Sadaka et al. | 438/187 |
| 2007/0241386 A1* | 10/2007 | Wang et al. | 257/314 |
| 2007/0269963 A1* | 11/2007 | Cheng et al. | 438/479 |
| 2007/0278593 A1 | 12/2007 | Watanabe | |
| 2007/0292999 A1 | 12/2007 | Henning et al. | |
| 2008/0079003 A1* | 4/2008 | Shaheen et al. | 257/64 |
| 2008/0124847 A1* | 5/2008 | Sudo | 438/152 |
| 2008/0128796 A1* | 6/2008 | Zhu et al. | 257/328 |
| 2008/0274595 A1* | 11/2008 | Spencer et al. | 438/154 |
| 2008/0280404 A1 | 11/2008 | Chudzik et al. | |
| 2009/0053864 A1* | 2/2009 | Liu et al. | 438/198 |
| 2009/0108301 A1* | 4/2009 | Yin et al. | 257/255 |
| 2009/0242942 A1* | 10/2009 | Zhu et al. | 257/255 |
| 2010/0052034 A1* | 3/2010 | Cheng et al. | 257/316 |

OTHER PUBLICATIONS

Tomohisa Mizuno et al., (110)-Surface Strained-SOI CMOS Devices, IEEE Transactions on Electron Devices, Mar. 2005, 367-374 vol. 52, No. 3.

M. Yang et al., High Performance CMOS Fabricated on Hybrid Substrate With Different Crystal Orientations, IEEE, 2003.

Min Yang et al., Hybrid-Orientation Technology (HOT): Opportunities and Challenges, IEEE, 2006.

B. Doris et al., A Simplified Hybrid Orientation Technology (SHOT) for High Performance CMOS, Symposium on VLSI Technology Digest of Technical Papers, IEEE, 2004, 9.2, 86-87.

Bin Yang, et al., CMOS Fabricated by Hybrid-Orientation Technology (HOT)—IEEE 2007, pp. 8-13.

* cited by examiner

CMOS STRUCTURE INCLUDING NON-PLANAR HYBRID ORIENTATION SUBSTRATE WITH PLANAR GATE ELECTRODES AND METHOD FOR FABRICATION

CROSS REFERENCE TO RELATED APPLICATION

This application is a continuation of U.S. application Ser. No. 12/039,177 filed Feb. 28, 2008, the entire content and disclosure of which is incorporated by reference.

BACKGROUND

1. Field of the Invention

The invention relates generally to complementary metal oxide semiconductor (CMOS) structures. More particularly, the invention relates to CMOS structures with enhanced performance.

2. Description of the Related Art

As semiconductor technology has advanced, and semiconductor structure and semiconductor device dimensions have decreased to a point that may be challenging physical limitations of semiconductor fabrication apparatus, alternative novel approaches have evolved for fabricating semiconductor structures and semiconductor devices with continued enhanced performance. One such alternative novel approach is predicated upon the observation that a charge carrier mobility of a field effect device may be optimized in connection with a selection of a particular crystallographic orientation, and a particular strain, of a semiconductor substrate within and upon which is fabricated the field effect device.

To that end, the use of hybrid orientation technology (HOT) substrates has become more common in the semiconductor fabrication art. A hybrid orientation technology substrate includes multiple semiconductor regions of different crystallographic orientation, and typically also dopant polarity, supported upon a single substrate.

Particular crystallographic orientation specific and strain specific effects upon charge carrier mobility within semiconductor structures are known in the semiconductor fabrication art.

Particular disclosures include: (1) Irie et al., "In-Plane Mobility Anisotropy and Universality Under Uni-axial Strains in n- and p-MOS Inversion Layers on (100), (110) and (111) Si," IEDM Technical Digest, December 2004, pp. 225-228; and (2) Mizuno et al., in "(110)-Surface Strained-SOI CMOS Devices," IEEE Trans on Electron Devices, 52(3), March 2005, pp. 367-374.

Various aspects of hybrid orientation technology substrates, including CMOS structure fabrication using hybrid orientation technology substrates, are also known in the semiconductor fabrication art.

Particular disclosures include: (1) Ieong et al., U.S. Pat. No. 6,815,278, U.S. Pat. No. 7,023,055 and U.S. Pub. No. 2006/0194421 (CMOS structures using hybrid orientation substrates and also including direct semiconductor substrate bonding); (2) Doris et al., U.S. Pub. No. 2004/0256700 (CMOS structures using hybrid orientation substrates and also including direct semiconductor substrate bonding); (3) Yeo et al., in U.S. Pat. No. 6,902,962 (CMOS structures using hybrid orientation substrates including silicon islands); (4) Chan et al., U.S. Pub. No. 2005/0236687 (CMOS structures using hybrid orientation substrates and also including direct semiconductor substrate bonding); (5) Wu et al. U.S. Pub. No. 2006/0292770 (CMOS structures using hybrid orientation substrates derived from double semiconductor-on-insulator (SOI) substrates); (6) Chuang et al., U.S. Pub. No. 2007/0018248 (a multiple threshold CMOS structure fabricated using an epitaxial semiconductor-on-insulator hybrid orientation substrate); and (7) Chan et al., U.S. Pub. No. 2007/0040235 (CMOS structures using hybrid orientation substrates and also including dual dimensioned isolation trenches).

Additional general and specific disclosures pertinent to hybrid orientation technology substrates include: (1) Yang et al., "Hybrid-Orientation Technology (HOT): Opportunities and Challenges," IEEE Trans. on Electron Devices, 53(3), May 2006, pp. 965-78; (2) Yang et al., "High Performance CMOS Fabricated on Hybrid Substrate With Different Crystallographic Orientations," IEDM Technical Digest, December 2003, pp. 18.7.1-18.7.4; and (3) Doris et al., "A Simplified Hybrid Orientation Technology (SHOT) for High Performance CMOS." 2004 Symp. on VLSI Technology Digest of Technical Papers, IEEE 2004, pp. 86-87.

The use of hybrid orientation technology substrates is likely to continue to evolve in prominence as semiconductor technology advances. To that end desirable are hybrid orientation technology substrates and related semiconductor structures, and methods for fabrication thereof, that provide for enhanced performance of semiconductor devices that are included within the semiconductor structures.

SUMMARY

The invention provides a semiconductor structure and a method for fabricating the semiconductor structure. The semiconductor structure in accordance with the invention includes a hybrid orientation technology substrate that includes a first active region having a first crystallographic orientation that is vertically (and typically also horizontally) separated from a second active region having a second crystallographic orientation different than the first crystallographic orientation. The semiconductor structure (which typically, but not necessarily exclusively, comprises a CMOS structure) includes a first field effect device having a first gate electrode located over the first active region and a second field effect device having a second gate electrode located over the second active region. Upper surfaces of the first gate electrode and the second gate electrode are coplanar.

Due to the differing vertical separation of the first active region and the second active region, the semiconductor structure in accordance with the invention may be fabricated absent any epitaxial growth with respect to the hybrid orientation technology substrate. To that end, epitaxial defects, which are otherwise common within the context of hybrid orientation technology substrates, may be avoided when fabricating a semiconductor structure in accordance with the invention.

A method for fabricating a semiconductor structure in accordance with the invention includes planarizing processing steps that provide that the upper surface of a first gate within a first field effect device within the first active region is coplanar with the upper surface of a second gate within a second field effect device within the second active region.

A particular semiconductor structure in accordance with the invention includes a semiconductor substrate including a first active region having a first crystallographic orientation vertically separated from a second active region having a second crystallographic orientation different than the first crystallographic orientation. This particular semiconductor structure also includes a first device including a first gate located within the first active region and a second device including a second gate located within the second active region. An upper surface of the first gate and an upper surface of the second gate are coplanar.

Another particular semiconductor structure in accordance with the invention includes a semiconductor substrate including a first active region having a first crystallographic orientation vertically separated from a second active region having a second crystallographic orientation different than the first crystallographic orientation. This other semiconductor structure also includes a p-type field effect transistor (pFET) including a first gate located within the first active region and an n-type field effect transistor (nFET) including a second gate located within the second active region. An upper surface of the first gate and an upper surface of the second gate are coplanar.

A particular method for fabricating a semiconductor structure in accordance with the invention includes providing a semiconductor structure that includes at least a base semiconductor substrate having a first crystallographic orientation and a surface semiconductor layer having a second crystallographic orientation different than the first crystallographic orientation. This particular method also includes etching at least the surface semiconductor layer to provide a semiconductor structure including a first active region within the base semiconductor substrate vertically separated from a second active region within the surface semiconductor layer. This particular method also includes forming a first device including a first gate within the first active region and a second device including a second gate within the second active region. An upper surface of the first gate and an upper surface of the second gate are coplanar.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein.

DESCRIPTION OF THE PREFERRED EMBODIMENTS

The invention, which includes a semiconductor structure and a method for fabricating the semiconductor structure, is understood within the context of the description set forth below. The description set forth below is understood within the context of the drawings described above. Since the drawings are intended for illustrative purposes, the drawings are not necessarily drawn to scale.

Figure 1:
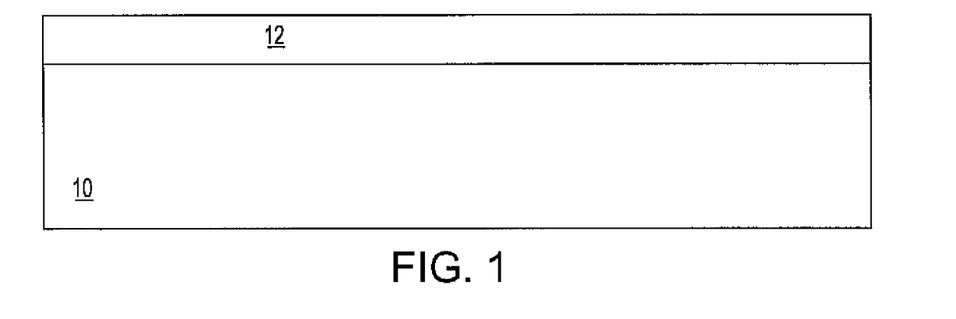
FIG. 1 to FIG. 12 shows a series of schematic cross-sectional diagrams illustrating the results of progressive stages in fabricating a CMOS semiconductor structure in accordance with a particular embodiment of the invention.

FIG. 1 to FIG. 13 show a series of schematic cross-sectional diagrams illustrating the results of progressive stages in fabricating a semiconductor structure in accordance with a particular embodiment of the invention. This particular embodiment of the invention comprises a first preferred embodiment of the invention. FIG. 1 shows a schematic cross-sectional diagram of the semiconductor structure at an early stage in the fabrication thereof in accordance with this particular first preferred embodiment.

FIG. 1 shows a base semiconductor substrate 10. FIG. 1 also shows a surface semiconductor layer 12 that is located upon and laminated to the base semiconductor substrate 10.

Each of the base semiconductor substrate 10 and the surface semiconductor layer 12 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Each of the base semiconductor substrate 10 and the surface semiconductor layer 12 may be doped, undoped or contain doped regions and undoped regions therein. Each of the base semiconductor substrate 10 and the surface semiconductor layer 12 may further contain regions with strain and regions without strain therein, or contain regions of tensile strain and compressive strain.

However, each of the base semiconductor substrate 10 and the surface semiconductor layer 12 is selected of appropriate materials composition, including crystallographic orientation, to individually optimize performance of a p-type field effect transistor (pFET) to be fabricated within an active region within the base semiconductor substrate 10 and an n-type field effect transistor (nFET) to be fabricated within an active region within the surface semiconductor layer 12. A reverse ordering of locations of the pFET and the nFET with respect to the active region within the base semiconductor substrate 10 and the active region within the surface semiconductor layer 12 is also contemplated within the instant embodiment. Further contemplated within the instant embodiment is a semiconductor structure that includes field effect devices other than field effect transistor devices, or alternatively a semiconductor structure that includes, in general, devices other than field effect transistor devices.

Although the foregoing semiconductor substrate 10 and surface semiconductor layer 12 materials requirements provide multiple options for the base semiconductor substrate 10 and the surface semiconductor layer 12, preferably, the base semiconductor substrate 10 comprises a (110) silicon or silicon-germanium alloy semiconductor material suitable doped for fabrication of a pFET. Preferably also, the surface semiconductor layer 12 comprises a (100) silicon or silicon-germanium alloy semiconductor material suitably doped for fabrication of an nFET.

Typically, the base semiconductor substrate 10 has a thickness from about 0.5 to about 3 millimeters. Typically, the surface semiconductor layer 12 has a thickness from about 5 to about 500 nanometers, which will provide a vertical differential between a first active region and a second active region that are formed within a semiconductor structure that results from further processing of the semiconductor structure of FIG. 1.

The semiconductor structure whose schematic cross-sectional diagram is illustrated in FIG. 1 may be fabricated using any of several methods. Non-limiting examples include lamination methods, layer transfer methods, compression bonding methods, thermo-compression bonding methods, sonic bonding methods and thermosonic bonding methods, as well as induced cleavage methods and planarizing methods such as but not limited to chemical mechanical polish planarizing methods.

Figure 2:
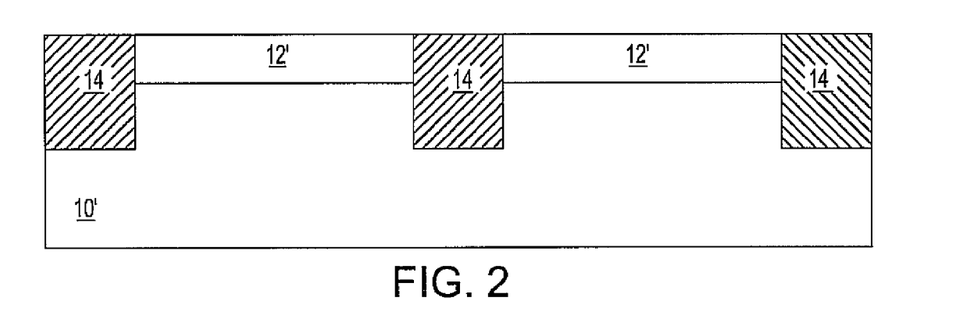

FIG. 2 shows an isolation region 14 located and formed penetrating through the surface semiconductor layer 12 and the base semiconductor substrate 10 to form a base semiconductor substrate 10' and a surface semiconductor layer 12'.

To form the semiconductor structure whose schematic cross-sectional diagram is illustrated in FIG. 2 from the semiconductor structure whose schematic cross-sectional diagram is illustrated in FIG. 1, isolation trenches are first etched through the surface semiconductor layer 12 and into the base semiconductor substrate 10 to form the base semiconductor substrate 10' and the surface semiconductor layer 12', although alternative etching depths are also contemplated within the context of the embodiment. The isolation trenches are then filled and planarized with an appropriate dielectric isolation material to form the isolation region 14. One or more sacrificial layers (not shown) may be employed in facilitating the formation of the isolation region 14.

The isolation region 14 may comprise any of several dielectric materials. Non-limiting examples include oxides, nitrides and oxynitrides, particularly of silicon, but oxides, nitrides and oxynitrides of other elements are not excluded. The isolation region 14 may comprise a crystalline or a non-crystalline dielectric material, with non-crystalline dielectric materials being highly preferred. The isolation region 14 may be formed using any of several methods. Non-limiting examples include ion implantation methods, thermal or plasma oxidation or nitridation methods, chemical vapor deposition methods and physical vapor deposition methods. Typically, the isolation region 14 comprises an oxide of the semiconductor material from which is comprised at least one of the base semiconductor substrate 10 and the surface semiconductor layer 12. Typically, the isolation region 14 extends into the base semiconductor substrate 10 with a depth from about 100 to about 500 nanometers measured from the top surface of the base semiconductor substrate 10.

Figure 3:
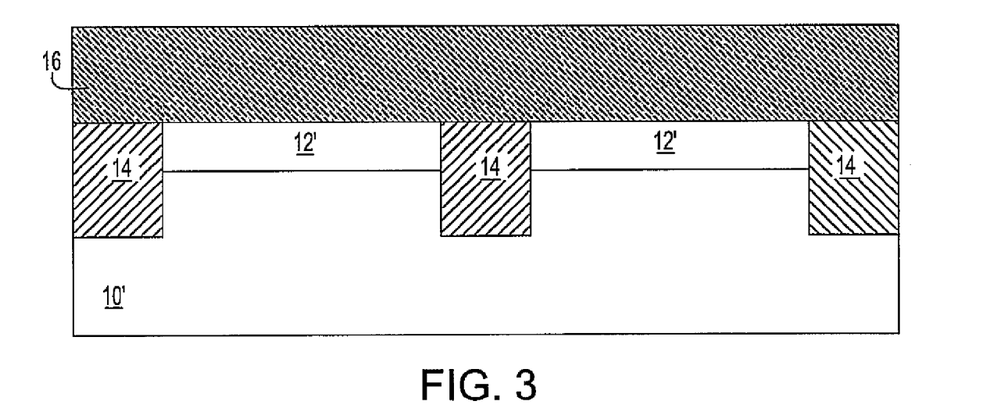

FIG. 3 shows a hard mask 16 located and formed upon the semiconductor structure of FIG. 2. The hard mask 16 may comprise any of several materials from which hard masks are generally comprised. Non-limiting examples include silicon nitride hard mask materials, silicon oxide hard mask materials, silicon oxynitride hard mask materials and high-k (i.e., greater than about 20) dielectric hard mask materials. The hard mask materials may be formed using any of several methods that are otherwise generally conventional in the semiconductor fabrication art. Such methods are generally similar to the methods used for forming the isolation regions 14. Under circumstances where, for example, the isolation region 14 comprises a silicon oxide dielectric material, the hard mask 16 comprises a silicon nitride material formed by a chemical vapor deposition (CVD) method, to thus provide for appropriate etch selectivity in accordance with further processing of the semiconductor structure of FIG. 3, in accordance with further description below.

Figure 4:
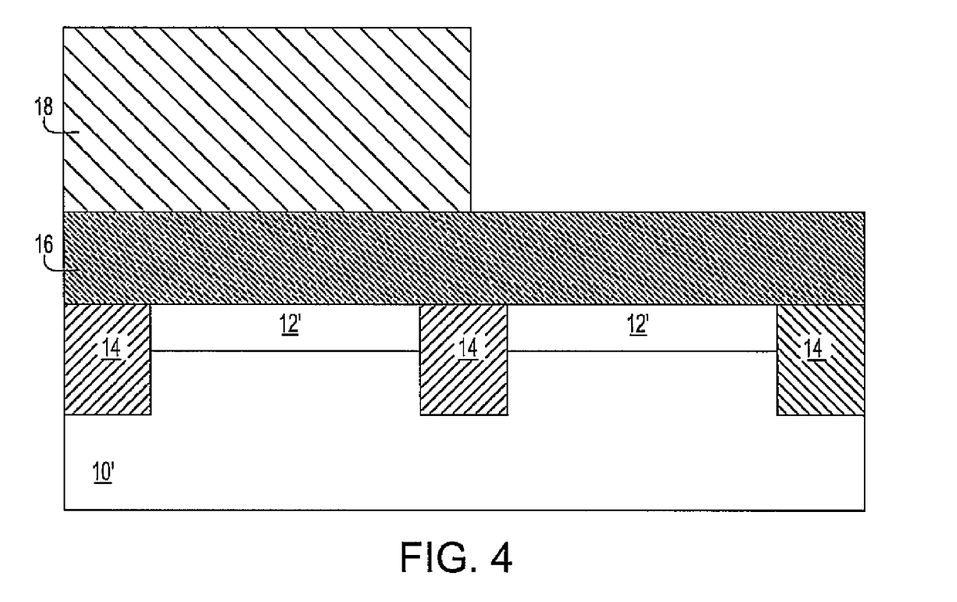

FIG. 4 shows a first photoresist layer 18 located and formed covering the left hand portion of the semiconductor structure whose schematic cross-sectional diagram is illustrated in FIG. 3. This particular embodiment alternatively contemplates that a related first photoresist layer may rather be located covering the right hand side of the semiconductor structure whose schematic cross-sectional diagram is illustrated in FIG. 3.

The first photoresist layer 18 may comprise any of several photoresist materials that are otherwise generally conventional in the semiconductor fabrication art. Non-limiting examples include positive photoresist materials, negative photoresist materials and hybrid photoresist materials that include properties of both positive photoresist materials and negative photoresist materials. Typically, the first photoresist layer 18 comprises a positive photoresist material or a negative photoresist material that has a generally conventional thickness.

Figure 5:
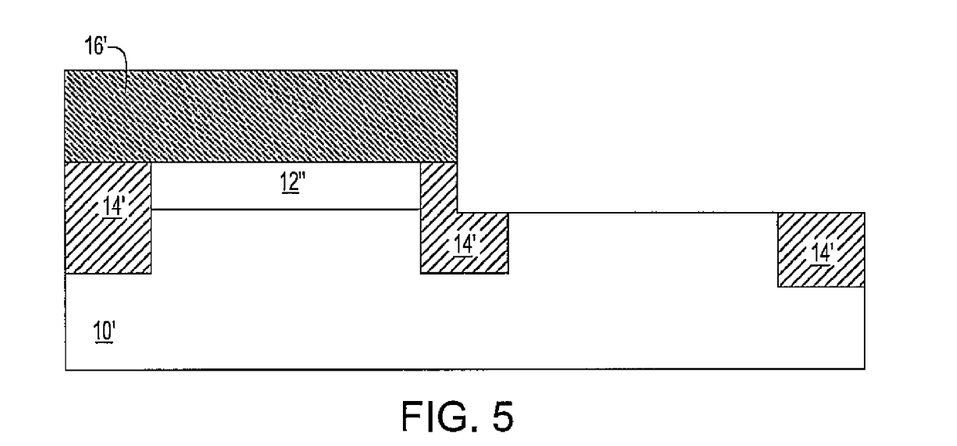

FIG. 5 first shows the results of etching the semiconductor structure of FIG. 4 while using the first photoresist layer 18 as a mask. The etching provides a hard mask layer 16' from the hard mask layer 16, a surface semiconductor layer 12" from the surface semiconductor layer 12' and an isolation region 14' from the isolation region 14. Within the context of the foregoing etching to form the surface semiconductor layer 12" and the isolation region 14', the base semiconductor substrate 10' may serve as an etch stop layer or an etch indicator layer to provide coplanar portions of the base semiconductor substrate 10 and the isolation region 14', although such is not a limitation or a requirement of the invention. Thus, the embodiment also contemplates that the base semiconductor substrate 10' may be etched somewhat when forming the semiconductor structure of FIG. 5 from the semiconductor structure of FIG. 4.

FIG. 5 also shows the results of stripping the first photoresist layer 18 after having etched the hard mask layer 16 to form the hard mask layer 16', the surface semiconductor layer 12' to form the surface semiconductor layer 12" and the isolation region 14 to form the isolation region 14'. The first photoresist layer 18 may be stripped using methods and materials that are otherwise generally conventional in the semiconductor fabrication art. Included in particular are wet chemical etch methods and materials, dry plasma etch methods and materials, and combinations of wet chemical etch methods and materials and dry plasma etch methods and materials.

Figure 6:
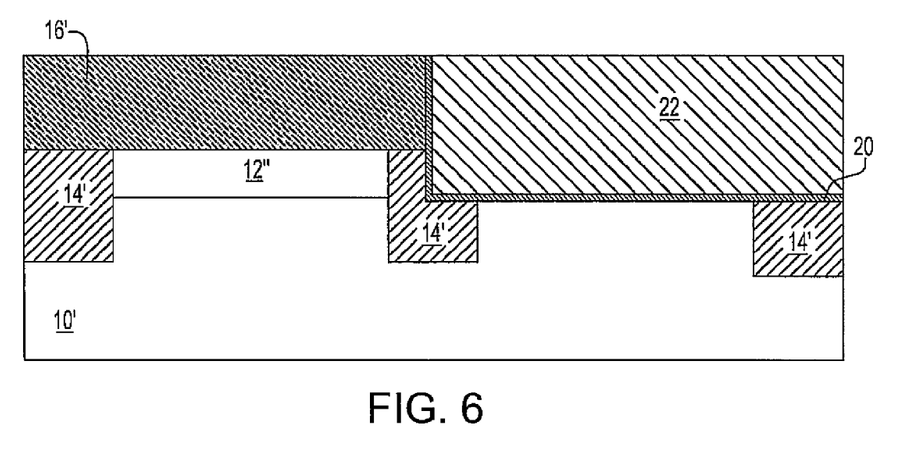

FIG. 6 shows a first gate dielectric 20 located and formed upon the right hand portion of the semiconductor structure whose schematic cross-sectional diagram is illustrated in FIG. 5 and in particular located and formed upon exposed portions of the base semiconductor substrate 10', the isolation region 14' and the hard mask layer 16'. FIG. 6 also shows a first gate electrode material layer 22 located and formed upon the first gate dielectric 20.

The first gate dielectric 20 may comprise conventional dielectric materials such as oxides, nitrides and oxynitrides of silicon that have a dielectric constant from about 3.9 to about 7.5, measured in vacuum. Alternatively, the first gate dielectric 20 may comprise generally higher dielectric constant dielectric materials having a dielectric constant from about 7.5 to at least about 100. Such higher dielectric constant dielectric materials may include, but are not limited to, hafnium oxide, hafnium-silicon oxide, hafnium-silicon oxynitride, lanthanum oxide, lanthanum-aluminum oxide, zirconium oxide, zirconium-silicon oxide, zirconium-silicon oxynitride, tantalum oxide, titanium oxide, barium-strontium-titanium oxide, barium-titanium oxide, strontium-titanium oxide, yttrium oxide, aluminum oxide, lead-scandium-tantalum oxide, lead-zinc-niobium oxide and lead-zirconium-titanium oxide dielectric materials, and any combination of those foregoing higher dielectric constant dielectric materials. The first gate dielectric 20 may be formed using any of several methods that are appropriate to the material(s) of composition of the first gate dielectric 20. Included, but not limiting, are thermal and/or plasma oxidation or nitridation methods, chemical vapor deposition methods, physical vapor deposition methods and atomic layer deposition methods. Typically, the first gate dielectric 20 comprises a generally higher dielectric constant dielectric material that has a generally conventional thickness from about 1.5 to about 10 nanometers.

The first gate dielectric 20 may further comprise an interfacial layer of silicon oxide, silicon nitride, or silicon oxynitride underneath the generally higher dielectric constant dielectric material. The interfacial layer, if present, generally has a thickness from about 0.5 to about 2 nanometers.

The first gate electrode material layer 22 may comprise materials including, but not limited to certain metals, metal alloys, metal nitrides and metal silicides, as well as laminates thereof and composites thereof. The first gate electrode material layer 22 may also comprise doped polycrystalline or amorphous silicon, germanium or silicon-germanium alloy (i.e., having a dopant concentration from about $1 \times 10^{18}$ to about $1 \times 10^{22}$ dopant atoms per cubic centimeter) and polycide materials (doped polysilicon (or polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the first gate electrode material layer 22 comprises a metal gate electrode material that has a generally conventional thickness from about 5 to about 100 nanometers.

As is understood by a person skilled in the art, the semiconductor structure whose schematic cross-sectional diagram is illustrated in FIG. 6 is typically formed by a blanket layer deposition of a blanket precursor layer for the first gate dielectric 20 and a blanket precursor layer for the first gate electrode material layer 22. Excess portions of those two blanket precursor layers may then be removed to provide the semiconductor structure of FIG. 6 while using a planarizing method, such as but not limited to a mechanical planarizing method or a chemical mechanical polishing planarizing method.

As is further understood by a person skilled in the art, a particular material of composition of the first gate dielectric 20 and the first gate electrode material layer 22 (i.e., which typically comprises a metal material) is selected to optimize performance of a pFET to be fabricated within the right hand side of the semiconductor structure of FIG. 6.

Figure 7:
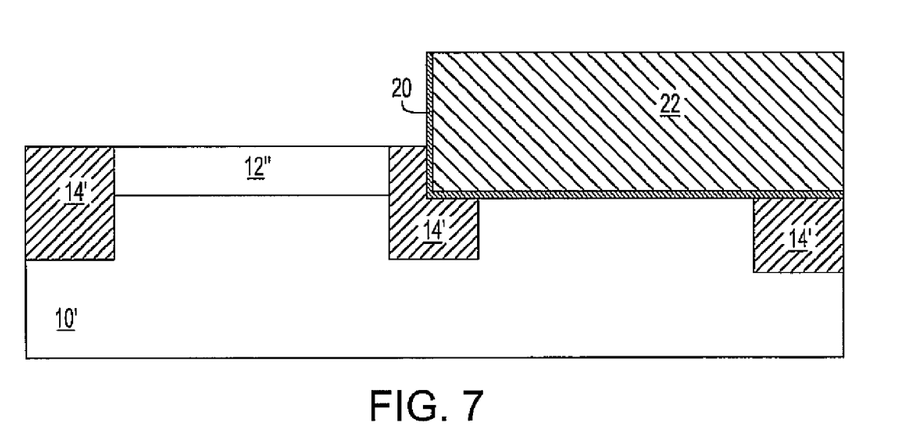

FIG. 7 shows the results of stripping the hard mask 16' from the semiconductor structure of FIG. 6 to leave exposed the surface semiconductor layer 12". The hard mask 16' may be stripped from the semiconductor structure of FIG. 6 to provide the semiconductor structure of FIG. 7 while using stripping methods and stripping materials that are otherwise generally conventional in the semiconductor fabrication art. Non-limiting examples include wet chemical stripping methods, dry plasma stripping methods and combinations and wet chemical stripping methods and dry plasma stripping methods.

Figure 8:
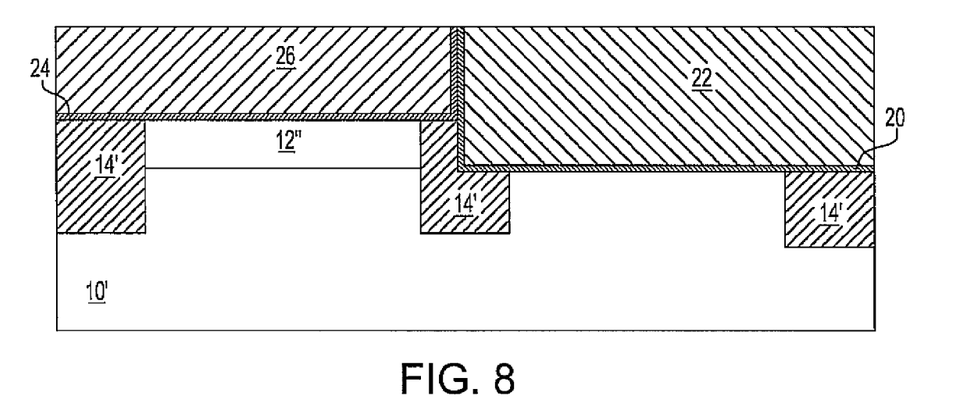

FIG. 8 shows a second gate dielectric 24 located and formed upon exposed portions of the surface semiconductor layer 12", the isolation region 14' and the first gate dielectric 20. FIG. 8 also shows a second gate electrode material layer 26 located and formed upon the second gate dielectric 24 upon the left hand side of the semiconductor structure. As is illustrated within the schematic cross-sectional diagram of FIG. 8, the second gate electrode material layer 26 and the second gate dielectric 24 are planarized to the level of the first gate dielectric 20 and the first gate electrode material layer 22 upon the right hand side of the semiconductor structure of FIG. 8.

The second gate dielectric 24 may comprise (the same or different) materials, have (the same or different) dimensions and be formed using (the same or different) methods that are otherwise generally analogous, equivalent or identical to the materials, dimensions and methods that are used for forming the first gate dielectric 20. The second gate electrode material layer 26 may similarly also comprise (the same or different) materials and be formed using (the same or different) methods that are otherwise generally analogous equivalent or identical to the materials and methods that are used for forming the first gate electrode material layer 22. Typically, the second gate electrode material layer 26 has a thickness from about 5 to about 100 nanometers.

Similarly, with the first gate dielectric 20 and the first gate electrode material layer 22, within the instant embodiment the materials of composition of the second gate dielectric 24 and the second gate electrode material layer 26 are preferably selected to provide optimized performance of an nFET that is fabricated using the surface semiconductor layer 12" as a channel. Further to that end, the first gate dielectric 20 may more specifically comprise a higher dielectric constant gate dielectric material (e.g., hafnium oxide with a silicon oxide underlayer), the first gate electrode material layer 22 may more particularly comprise a metal gate material (e.g., titanium nitride), the second gate dielectric 24 may more particularly comprise a higher dielectric constant gate dielectric material (e.g., hafnium oxide with an silicon oxide underneath) and the second gate electrode material layer 26 may more particularly comprise a metal gate material (e.g., molybdenum nitride). Furthermore, an interfacial layer (not shown) such as a metal or metal oxide (e.g., aluminum oxide) with a thickness about 0.2 to about 1 nanometers may be formed between the first gate dielectric 20 and the first gate electrode material layer 22 to further optimize performance of a pFET. Similarly, an interfacial layer (not shown) such as a metal or metal oxide (e.g., lanthanum oxide) with a thickness about 0.2 to about 1 nanometers may be formed between the second gate dielectric 24 and the second gate electrode material layer 26 to further optimize performance of an nFET.

Also similarly with the first gate dielectric 20 and the first gate electrode material layer 22, each of the second gate dielectric 24 and the second gate electrode material layer 26 derives from an initially deposited blanket layer that is planarized.

Figure 9:
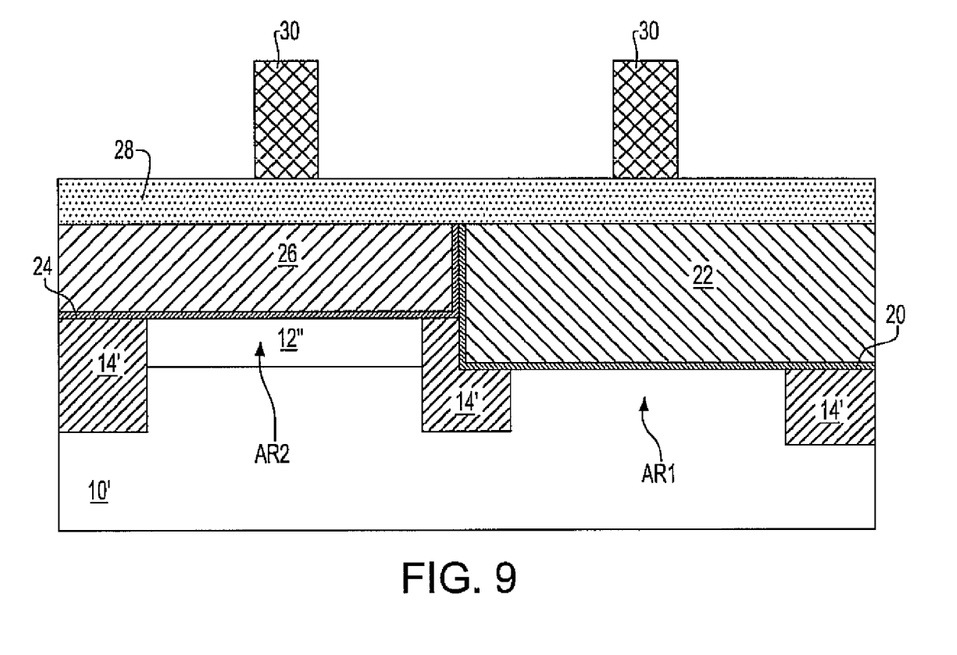

FIG. 9 shows an optional gate electrode supplemental material layer 28 located and formed upon the semiconductor structure of FIG. 8. The gate electrode supplemental material layer 28 may comprise any of several conductor materials that serve effectively as gate electrode supplemental materials. Included in general are the same types and selections of materials that are used for the first gate electrode material layer 22 and the second gate electrode material layer 26. More particularly, the gate electrode supplemental material layer 28 comprises a doped polysilicon gate electrode supplemental material that has a thickness from about 10 to about 100 nanometers.

FIG. 9 finally shows a plurality of second masking layers 30 located and formed upon the gate electrode supplemental material layer 28 and centered above a first active region AR1 within the base semiconductor substrate 10' and a second active region AR2 within the surface semiconductor layer 12". The plurality of second masking layers 30 may comprise photoresist materials, or photoresist materials in combination with hardmask materials (e.g., silicon oxide or silicon nitride), although other materials combinations for the plurality of second masking layers is not excluded. The photoresist materials may have thickness dimensions and be formed using methods that are otherwise generally analogous, equivalent or identical to photoresist materials, thickness dimensions and methods that are used within the context of the first photoresist layer 18 that is illustrated in FIG. 4. Nonetheless the plurality of second photoresist layers 30 possesses a narrower linewidth in a range from about 15 to about 300 nanometers.

Figure 10:
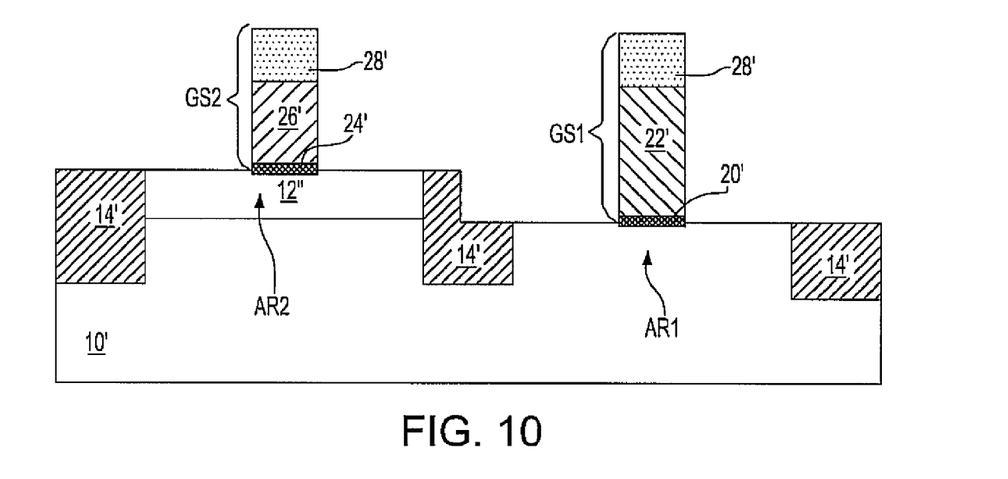

FIG. 10 shows the results of patterning the gate electrode supplemental material layer 28, the second gate electrode material layer 26, the first gate electrode material layer 22, the second gate dielectric 24 and the first gate dielectric 20 to form a first gate stack GS1 upon the first active region AR1 and a second gate stack GS2 upon the second active region AR2. The first gate stack GS1 includes a first gate dielectric 20', a first gate electrode material layer 22' and a gate electrode supplemental material layer 28'. The second gate stack GS2 includes a second gate dielectric 24', a second gate electrode material layer 26' and a gate electrode supplemental material layer 28'.

The foregoing patterning to form the first gate stack GS1 and the second gate stack GS2 from their corresponding precursor layers is typically effected using a plasma etch method that in turn includes the use of an appropriate etchant gas composition, or series of etchant gas compositions, with respect to the materials of composition of the gate electrode supplemental material layer 28, the second gate electrode material layer 26, the first gate electrode material layer 22, the second gate dielectric 24 and the first gate dielectric 20. The use of the foregoing plasma etch method is intended to provide generally straight sidewalls to the first gate stack GS1 and the second gate stack GS2.

Figure 11:
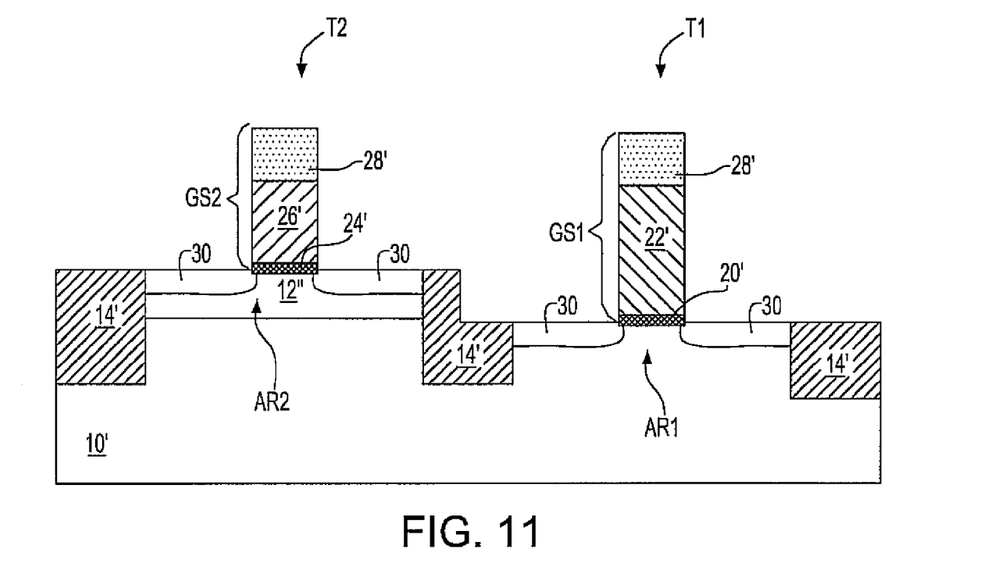

FIG. 11 shows a plurality of source and drain regions 31 located and formed into portions of the first active region AR1 and the second active region AR2 not covered, respectively, by the first gate stack GS1 and the second gate stack GS2. The plurality of source and drain regions 31 comprises a generally conventional n conductivity type or p conductivity type dopant as appropriate to fabricate a pFET as a first transistor T1 within the first active region AR1 and an nFET as a second transistor T2 within the second active region AR2. The plurality of source and drain regions 30 is typically formed using an ion implantation method that may comprise a single step ion implantation method (i.e., either with or without spacers that are illustrated in further detail below) or a multiple-step ion implantation method (i.e., both with and without spacers that are illustrated in further detail below). Typically, dopant concentrations are from about $10^{19}$ to about $10^{21}$ dopant atoms per cubic centimeter within each of the plurality of source and drain regions 31. The transistors T1 and T2 may further comprise other structures (not shown) such as but not limited to conventional or non-conventional halo implant regions or pocket implant regions formed by methods such as but not limited to angled ion implantation methods.

Figure 12:
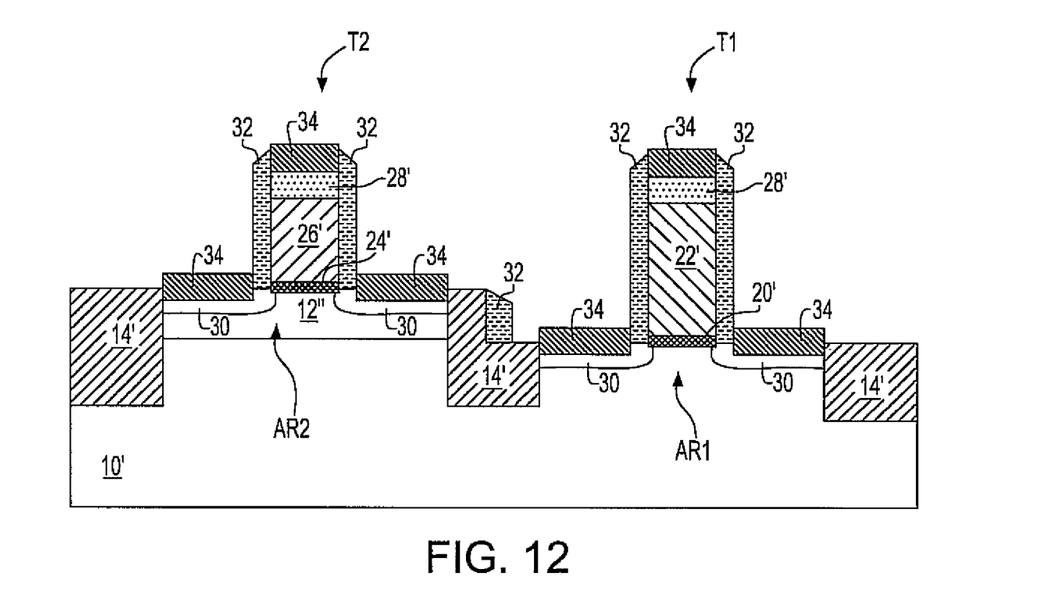

FIG. 12 shows a plurality of spacers 32 located adjacent and adjoining the first gate stack GS1 within the first transistor T1 and the second gate stack GS2 within the second transistor T2, as well as located adjacent and adjoining an exposed sidewall portion of the isolation region 14' that separates differentially vertically elevated portions of the isolation region 14' as well as differentially elevated portions of the first active region AR1 and the second active region AR2. Although illustrated as plural layers in cross-section, the spacers 32 are intended as encircling each of the individual first gate stack GS1 and the second gate stack GS2 in plan view.

The spacers 32 may comprise materials including but not limited to conductor materials and dielectric materials. Conductor spacer materials are less common, but are nonetheless known. Dielectric spacer materials are more common. The spacer materials may be formed using methods analogous, equivalent or identical to the methods that are used for forming the isolation region 14'. The spacers 32 are also formed with the distinctive inward pointing spacer shape by using a blanket layer deposition and anisotropic etchback method. Typically, the spacers 32 comprise a silicon oxide dielectric material, a silicon nitride dielectric material, a low-k (low dielectric constant) material, or a combination thereof.

FIG. 12 also shows a plurality of silicide layers 34 located and formed upon exposed silicon containing surfaces within the first transistor T1 and the second transistor T2, including the source and drain regions 30 and the gate electrode supplemental material layers 28'. The silicide layers 34 may comprise any of several silicide forming metals. Non-limiting examples of candidate silicide forming metals include nickel, cobalt, titanium, tungsten, erbium, ytterbium, platinum, and vanadium silicide forming metals. Nickel and cobalt silicide forming metals are particularly common. Typically, the silicide layers 34 are formed using a salicide method. The salicide method includes: (1) forming a blanket silicide forming metal layer upon the semiconductor structure of FIG. 11; (2) thermally annealing the blanket silicide forming metal layer with silicon surfaces which it contacts to selectively form the silicide layers 34 while leaving unreacted metal silicide forming metal layers on, for example, the spacers 32 and the isolation region 14'; and (3) selectively stripping unreacted portions of the silicide forming metal layers from, for example, the spacers 32 and the isolation regions 14'. Typically, the silicide layers 34 comprise a nickel silicide material or a cobalt silicide material that has a thickness from about 5 to about 50 nanometers, from about 8 to 20 nanometers being particularly common.

FIG. 12 shows a schematic cross-sectional diagram of a semiconductor structure in accordance with a first embodiment of the invention. The semiconductor structure includes a hybrid orientation technology substrate that includes: (1) a first active region AR1 within the base semiconductor substrate 10' that has a first crystallographic orientation; where the first active region is vertically (and horizontally) separated from (2) a second active region AR2 within the surface semiconductor layer 12" that has a second crystallographic orientation different than the first crystallographic orientation. Such a "vertical separation" is intended as including different stepped levels with respect to a plane of the base semiconductor substrate 10'. The different stepped levels are intended not to overlap. The semiconductor structure also includes a first device (i.e., preferably pFET first transistor T1) located and formed within and upon the first active region AR1 and a second device (i.e., preferably nFET second transistor T2) located and formed within and upon the second active region AR2. By using within the instant embodiment the hybrid orientation technology substrate that includes the first active region AR1 vertically separated from the second active region AR2, the embodiment provides for avoidance of an epitaxial deposition process step that would otherwise generally conventionally be used for forming a hybrid orientation technology substrate with coplanar active regions. The avoidance of such an epitaxial method also allows for avoidance of epitaxially introduced defects within at least one of the active regions (i.e., the first active region AR1) that comprises the hybrid orientation technology substrate used within the embodiment.

Figure 13:
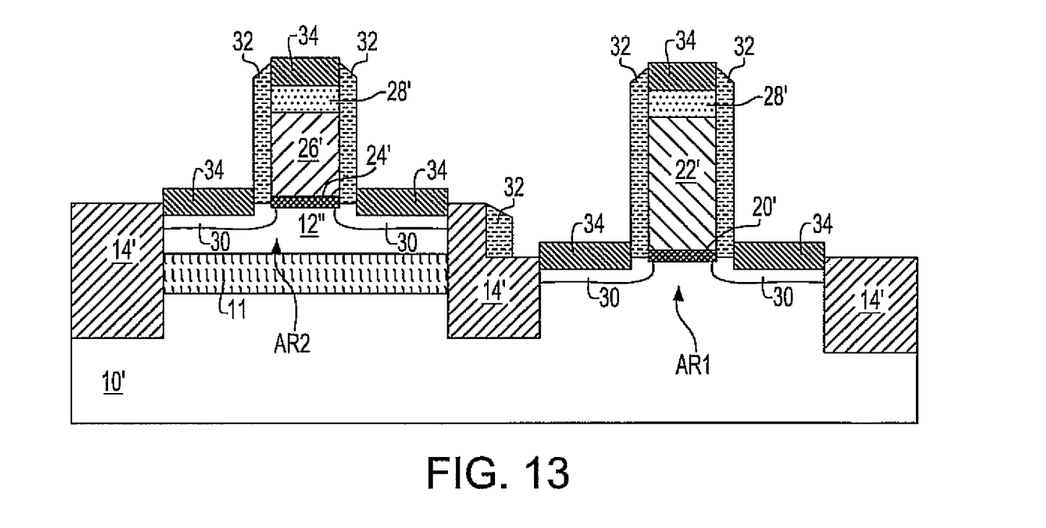
FIG. 13 shows a schematic cross-sectional diagram illustrating a CMOS semiconductor structure in accordance with another particular embodiment of the invention.

FIG. 13 shows a schematic cross-sectional diagram of a semiconductor structure in accordance with another embodiment of the invention. This other embodiment of the invention comprises a second preferred embodiment of the invention.

The semiconductor structure of FIG. 13 differs from the semiconductor structure of FIG. 12 within the context of the presence of a buried dielectric layer 11 located interposed between the surface semiconductor layer 12" and the base semiconductor substrate 10' beneath the first transistor T1. Thus, within this second embodiment, the second transistor T2 is completely dielectrically isolated from the first transistor T1, rather than being isolated through use of semiconductor junctions. Typically, the buried dielectric layer 11 has a thickness from about 10 to about 200 nanometers, which in conjunction with the foregoing thickness of the surface semiconductor layer 12" will provide a vertical separation distance of the first active region AR1 and the second active region AR2 from about 20 to about 400 nanometers.

As is understood by a person skilled in the art, the semiconductor structure whose schematic cross-sectional diagram is illustrated in FIG. 13 may be fabricated using a largely analogous series of processing steps to the series of process steps that is used for fabricating the semiconductor structure whose schematic cross-sectional diagram is illustrated in FIG. 12, but rather also starting with a semiconductor-on-insulator semiconductor substrate rather than the direct semiconductor bonded and laminated base semiconductor substrate 10 and surface semiconductor layer 12 that provides the semiconductor structure that is illustrated in FIG. 1. Such a semiconductor-on-insulator substrate nonetheless derives from the semiconductor structure that is illustrated in FIG. 1, but with a buried dielectric layer located interposed between the base semiconductor substrate 10 and the surface semiconductor layer 12. When fabricating the semiconductor structure of FIG. 13, both the surface semiconductor layer 12 and such a buried dielectric layer are etched to provide in part the semiconductor structure of FIG. 13.

The semiconductor structure whose schematic cross-sectional diagram is illustrated in FIG. 13 possesses all of the advantages of the semiconductor structure whose schematic cross-sectional diagram is illustrated in FIG. 12 but with a complete dielectric isolation of the first transistor T1 and the second transistor T2 rather than at least in-part a junction isolation of the first transistor T1 and the second transistor T2.

The foregoing preferred embodiments are illustrative of the invention rather than limiting of the invention. Revisions and modifications may be made to methods, materials, structures and dimensions of a semiconductor structure in accordance with the foregoing preferred embodiments, while still providing a semiconductor structure and a method for fabrication thereof in accordance with the invention, further in accordance with the accompanying claims.

What is claimed is:

1. A semiconductor structure comprising:
    a substrate comprising a first active region including a first crystallographic orientation material and a second active region including a second crystallographic orientation material, wherein a first upper surface of the first crystallographic orientation material is vertically offset and located beneath a second upper surface of the second crystallographic orientation material, wherein the second crystallographic orientation material is different than the first crystallographic orientation material;
    an isolation region located between the first active device region and the second active device region, wherein said isolation region has a topmost that is vertically offset and located above a recessed surface of the isolation region, wherein said topmost surface of said isolation region is coplanar with said second upper surface of the second crystallographic orientation material; and
    a p-type field effect transistor including a first gate located within the first active region and an n-type field effect transistor including a second gate located within the second active region, where an upper surface of the first gate and an upper surface of the second gate are coplanar, and a first gate dielectric of the first gate is in direct contact with the first upper surface, and a second gate dielectric of the second gate is in direct contact with the second upper surface.

2. The semiconductor structure of claim 1, wherein the first gate comprises a first gate material and the second gate comprises a second gate material different than the first gate material.

3. The semiconductor structure of claim 1, wherein the substrate comprises a bulk semiconductor substrate.

4. The semiconductor structure of claim 1, wherein the substrate comprises a semiconductor-on-insulator substrate.

5. The semiconductor structure of claim 1, wherein at least one of the first gate and the second gate comprises a silicon material.

6. The semiconductor structure of claim 1, wherein at least one of the first gate and the second gate comprises a metal material.

7. The semiconductor structure of claim 1, wherein the first crystallographic orientation material comprises silicon having a (110) and the second crystalline orientation material comprises silicon germanium.

8. The semiconductor structure of claim 1, wherein the first crystallographic orientation material comprises silicon germanium and the second crystalline orientation material comprises silicon having a (100) orientation.

9. The semiconductor structure of claim 1, further comprising a spacer material having a sidewall surface located on a vertical sidewall of said isolation region and a base surface located on said recessed surface of said isolation region.

10. The semiconductor structure of claim 1, wherein said recessed surface of the isolation region is coplanar with said first upper surface of the first crystallographic orientation material.

11. A semiconductor structure comprising:
    a substrate comprising a first active region including a first crystallographic orientation material and a second active region including a second crystallographic orientation material, wherein a first upper surface of the first crystallographic orientation material is vertically offset and located beneath a second upper surface of the second crystallographic orientation material, wherein the second crystallographic orientation material has a different crystalline orientation than the first crystallographic orientation material;
    an isolation region located between the first active device region and the second active device region, wherein said isolation region has a topmost that is vertically offset and located above a recessed surface of the isolation region, wherein said topmost surface of said isolation region is coplanar with said second upper surface of the second crystallographic orientation material; and
    a p-type field effect transistor including a first gate located within the first active region and an n-type field effect transistor including a second gate located within the second active region, where an upper surface of the first gate and an upper surface of the second gate are coplanar, and a first gate dielectric of the first gate is in direct contact with the first upper surface, and a second gate dielectric of the second gate is in direct contact with the second upper surface.

12. The semiconductor structure of claim 11, wherein the first gate comprises a first gate material and the second gate comprises a second gate material different than the first gate material.

13. The semiconductor structure of claim 11, wherein the substrate comprises a bulk semiconductor substrate.

14. The semiconductor structure of claim 11, wherein the substrate comprises a semiconductor-on-insulator substrate.

15. The semiconductor structure of claim 11, wherein at least one of the first gate and the second gate comprises a silicon material.

16. The semiconductor structure of claim 11, wherein at least one of the first gate and the second gate comprises a metal material.

17. The semiconductor structure of claim 11, further comprising a spacer material having a sidewall surface located on a vertical sidewall of said isolation region and a base surface located on said recessed surface of said isolation region.

18. The semiconductor structure of claim 11, wherein said recessed surface of the isolation region is coplanar with said first upper surface of the first crystallographic orientation material.

* * * * *